United States Patent
Cheng et al.

(10) Patent No.: US 9,595,589 B2
(45) Date of Patent: Mar. 14, 2017

(54) TRANSISTOR WITH PERFORMANCE BOOST BY EPITAXIAL LAYER

(71) Applicant: Taiwan Semiconductor Manufacturing Co., Ltd., Hsin-Chu (TW)

(72) Inventors: Yu-Hung Cheng, Tainan (TW); Cheng-Ta Wu, Shueishang Township (TW); Yeur-Luen Tu, Taichung (TW); Chia-Shiung Tsai, Hsin-Chu (TW); Ru-Liang Lee, Hsinchu (TW); Tung-I Lin, Tainan (TW); Wei-Li Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/980,553

(22) Filed: Dec. 28, 2015

(65) Prior Publication Data

US 2016/0111511 A1 Apr. 21, 2016

Related U.S. Application Data

(63) Continuation of application No. 14/187,850, filed on Feb. 24, 2014, now Pat. No. 9,245,974.

(51) Int. Cl.
*H01L 29/167* (2006.01)
*H01L 29/207* (2006.01)
(Continued)

(52) U.S. Cl.
CPC .... *H01L 29/42364* (2013.01); *H01L 21/0262* (2013.01); *H01L 21/02532* (2013.01);
(Continued)

(58) Field of Classification Search
CPC ........... H01L 21/2022; H01L 21/76805; H01L 21/8229; H01L 21/3212; H01L 21/76205;
(Continued)

(56) References Cited

U.S. PATENT DOCUMENTS

| | | | | |
|---|---|---|---|---|
| 7,553,717 B2* | 6/2009 | Chakravarthi | ...... | H01L 21/3065 438/197 |
| 7,745,303 B2* | 6/2010 | Yamamoto | ........ | H01L 21/76235 438/424 |

(Continued)

OTHER PUBLICATIONS

Rezzak, Nadia "The Effect of Shallow Trench Isolation (STI) Topology, Sidewall Doping and Layout-Related Stress on Radiation-Induced Leakage Current." Vanderbilt University, May 2010. 78 Pages.

(Continued)

*Primary Examiner* — David Nhu
(74) *Attorney, Agent, or Firm* — Eschweiler & Associates, LLC

(57) ABSTRACT

The present disclosure relates to a transistor device. In some embodiments, the transistor device has an epitaxial layer disposed over a substrate. The epitaxial layer is arranged between a source region and a drain region separated along a first direction. Isolation structures are arranged on opposite sides of the epitaxial layer along a second direction, perpendicular to the first direction. A gate dielectric layer is disposed over the epitaxial layer, and a conductive gate electrode is disposed over the gate dielectric layer. The epitaxial layer overlying the substrate improves the surface roughness of the substrate, thereby improving transistor device performance.

20 Claims, 9 Drawing Sheets

(51) Int. Cl.
| | |
|---|---|
| *H01L 29/227* | (2006.01) |
| *H01L 31/0288* | (2006.01) |
| *H01L 29/423* | (2006.01) |
| *H01L 29/66* | (2006.01) |
| *H01L 21/02* | (2006.01) |
| *H01L 29/10* | (2006.01) |
| *H01L 27/146* | (2006.01) |
| *H01L 29/06* | (2006.01) |
| *H01L 29/16* | (2006.01) |
| *H01L 29/165* | (2006.01) |

(52) U.S. Cl.
CPC .. *H01L 21/02579* (2013.01); *H01L 21/02636* (2013.01); *H01L 27/14614* (2013.01); *H01L 27/14638* (2013.01); *H01L 29/0649* (2013.01); *H01L 29/0688* (2013.01); *H01L 29/105* (2013.01); *H01L 29/1037* (2013.01); *H01L 29/1054* (2013.01); *H01L 29/16* (2013.01); *H01L 29/4236* (2013.01); *H01L 29/66636* (2013.01); *H01L 29/66651* (2013.01); *H01L 29/66666* (2013.01); *H01L 29/165* (2013.01)

(58) Field of Classification Search
CPC ........... H01L 21/8238; H01L 21/02332; H01L 21/048; H01L 21/0455; H01L 21/67069; H01L 27/0924; H01L 29/7816
USPC .. 257/58, 288, 396, 389, 701, 607, E21.006, 257/E21.042, E21.051, E21.109, 257/E21.097, E21.102, E21.13, E21.17, 257/E21.229, E21.267, E21.278, 257/E21.304, E21.319, E21.545, 257/E21.564, E21.632, E21.645, E21.646
See application file for complete search history.

(56) References Cited

U.S. PATENT DOCUMENTS

| | | | |
|---|---|---|---|
| 7,919,816 B2 | 4/2011 | Gossner et al. | |
| 8,159,011 B2 | 4/2012 | Hynecek | |
| 8,531,567 B2 | 9/2013 | Roy et al. | |
| 8,716,078 B2* | 5/2014 | Disney | H01L 29/66909 438/186 |
| 8,790,969 B2 | 7/2014 | Mondo et al. | |
| 8,829,574 B2* | 9/2014 | Disney | H01L 29/66893 257/263 |
| 8,835,936 B2 | 9/2014 | Hoentschel et al. | |
| 8,841,708 B2 | 9/2014 | Disney et al. | |
| 9,117,841 B2* | 8/2015 | Zhang | H01L 29/6659 |
| 2008/0150021 A1 | 6/2008 | Koops et al. | |
| 2008/0277699 A1 | 11/2008 | Chakravarthi et al. | |
| 2008/0315288 A1 | 12/2008 | Kikuchi et al. | |
| 2013/0153988 A1 | 6/2013 | Loechelt et al. | |
| 2013/0161705 A1 | 6/2013 | Disney et al. | |

OTHER PUBLICATIONS

Lee, et al. "Gate Oxide Thinning Effects at the Edge of Shallow Trench Isolation in the Dual Gate Oxide Process." IEEE, ICVC '99. 6th International Conference on VLSI and CAD, pp. 249-252, Oct. 26, 1999.
Non-Final Office Action dated Apr. 2, 2015 for U.S. Appl. No. 14/187,850.
Non-Final Office Action dated Jun. 11, 2015 for U.S. Appl. No. 14/187,850.
Notice of Allowance dated Sep. 16, 2015 for U.S. Appl. No. 14/187,850.

* cited by examiner

TRANSISTOR WITH PERFORMANCE BOOST BY EPITAXIAL LAYER

REFERENCE TO RELATED APPLICATION

This Application is a Continuation of U.S. application Ser. No. 14/187,850 filed on Feb. 24, 2014, which issued as U.S. Pat. No. 9,245,974 B2, the contents of which are incorporated by reference in their entirety.

BACKGROUND

Complementary metal-oxide-semiconductor (CMOS) transistor devices are the building blocks of modern day integrated chips. CMOS transistor devices use local oxidation to attain a planar topology that lends itself to easy metal interconnect coverage and high device density, thereby allowing for a large number of CMOS transistor devices to be connected together on a same integrated chip. By interconnecting a large number of CMOS transistor devices together, an integrated chip can be formed to implement increasingly complex functionalities.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
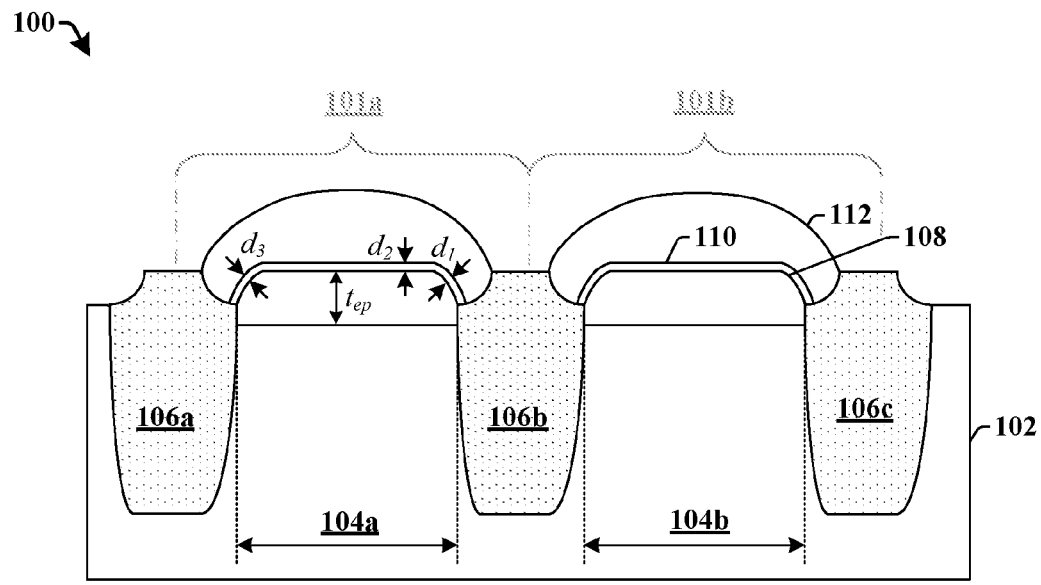
FIGS. 1A-1B illustrate the cross-sectional and top views, respectively, of transistor devices having an epitaxial layer disposed between an underlying recessed active region and an overlying gate dielectric layer in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) transistor may be built by forming a plurality of doped active regions within a semiconductor substrate. The active regions are separated from one another by isolation structures that provide for electrical isolation. A gate dielectric layer is formed on top of an active region at a position separating source and drain regions disposed within the active region. A gate electrode is subsequently formed over the gate dielectric layer. The gate electrode, separated from the active region by the gate dielectric layer, is configured to control the flow charge carriers between the source and drain regions.

As the size of CMOS transistors has decreased due to scaling, it has been appreciated that a number of processing issues may arise along the corners of the active regions abutting the isolation structures. For example, the oxide etch rate at corners of the isolation structures is faster than that at a center of an active region, leading to thinning of the gate dielectric layer at isolation structure corners. The thinning of gate dielectric layer adversely affects the gate oxide integrity (GOI) as the thinner region experiences a higher electric field for a same applied gate voltage. Furthermore, it is hard to control the active region corner rounding and profiles, thereby allowing bulk dopants (e.g., boron) to diffuse into the active region and cause a threshold voltage variation.

Accordingly, the present disclosure relates to a method, and an associated apparatus, of generating a transistor device having an epitaxial layer disposed over a recessed active region. The epitaxial layer is configured to improve transistor device performance. In some embodiments, the method is performed by providing a semiconductor substrate having a plurality of original active regions. The semiconductor substrate is selectively etched to form a plurality of trenches that extend into the semiconductor substrate between the original active regions. The original active regions are etched back to remove a portion of the original active regions and thereby form recessed active regions. An epitaxial growth is then performed in-situ after the etch back to form an epitaxial layer on the recessed active regions. The epitaxial layer offers a number of advantages that improve transistor device performance including an enlarged effective width and an overlying dielectric layer with a uniform thickness.

Figure 1B:
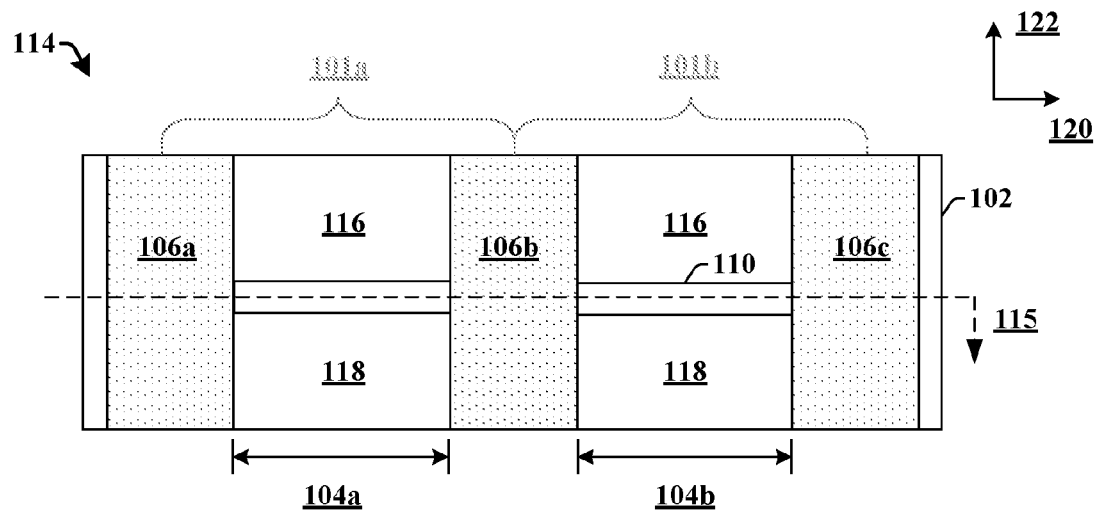

FIG. 1A illustrates some embodiments of a cross-sectional view 100 (along line 115 of FIG. 1B) of disclosed transistor devices 101a, 101b having an epitaxial layer 108 disposed between an underlying recessed active region 104 and an overlying gate dielectric layer 110. FIG. 1B illustrates some embodiments of a top-view 114 of the disclosed transistor device.

As shown in cross-sectional view 100, the transistor devices 101a, 101b comprise recessed active regions 104a, 104b disposed within a semiconductor substrate 102. In various embodiments, the semiconductor substrate 102 may comprise any type of semiconductor body (e.g., silicon, silicon-germanium, silicon-on-insulator, III-V materials, etc.) such as a semiconductor wafer and/or one or more die on a semiconductor wafer, as well as any other type of semiconductor and/or epitaxial layers associated therewith. The recessed active regions 104a, 104b are regions of semiconductor material that are doped opposite that of a surrounding region (e.g., a well region) of the semiconductor substrate 102.

As shown in top-view 114, the recessed active regions 104a, 104b comprise a source region 116 and a drain region 118. In some embodiments, the transistor devices 101a, 101b may comprise an NMOS transistor having source and drain regions, 116 and 118, comprising an n-type material disposed within a p-type semiconductor substrate. In other embodiments, the transistor devices 101a, 101b may comprise a PMOS transistor having source and drain regions, 116 and 118, comprising a p-type material disposed within an n-type semiconductor substrate.

A plurality of isolation structures 106a-106c are disposed within the semiconductor substrate 102 at positions that separate the semiconductor substrate 102 into alternating isolation structures 106 and active regions 104. The recessed active regions 104a, 104b have a top surface that is below the surrounding isolation structures 106a-106c. The isolation structures 106a-106c are configured to prevent current leakage between transistor devices 101a, 101b formed in adjacent recessed active regions 104. In some embodiments, the isolation structures 106a-106c comprise shallow trench isolation (STI) structures having a dielectric material disposed within a trench in the semiconductor substrate 102.

An epitaxial layer 108 is disposed over the recessed active regions 104a, 104b. The epitaxial layer 108 is positioned between adjacent isolation structures (e.g., 106a and 106b) in a first lateral direction 120 and comprises a channel region that extends between the source region 116 and the drain region 118 in a perpendicular, second lateral direction 122. In some embodiments, the epitaxial layer 108 is doped with a dopant, such as a boron dopant, a phosphorus dopant, or a carbon dopant. In some embodiments, the epitaxial layer 108 may have a thickness $t_{ep}$ that is in a range of between approximately 3 nm and approximately 30 nm.

A gate dielectric layer 110 is disposed over the epitaxial layer 108. In some embodiments, the gate dielectric layer 110 has a substantially uniform thickness over the epitaxial layer 108. For example, in some embodiments, the gate dielectric layer 110 may have a first thickness $d_1$ at a first position, a second thickness $d_2$ at a second position, and a third thickness $d_3$ at a third position, wherein $d_1 \approx d_2 \approx d_3$. The substantially uniform thickness of the gate dielectric layer 110 at the corners of the isolation structures 106 may improve tailing of a break-down voltage ($V_{bd}$) and/or a gate current ($I_{gi}$).

A gate electrode 112 is disposed at a position overlying the gate dielectric layer 110. The gate electrode 112 is configured to control the flow of charge carriers (e.g., electrons and/or holes) within the channel region of the epitaxial layer 108 extending between the source region 116 and the drain region 118. In some embodiments, the gate electrode 112 may comprise a poly-silicon gate electrode overlying the gate dielectric layer 110. In other embodiments, the gate electrode 112 may comprise a metal gate electrode (e.g., an aluminum gate electrode) overlying the gate dielectric layer 110.

Figure 2:
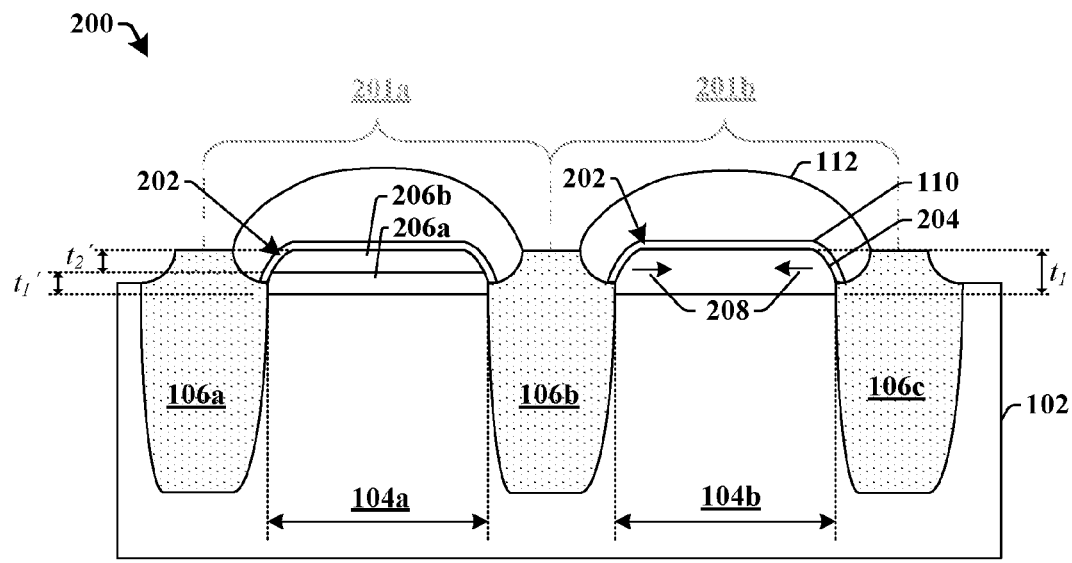
FIG. 2 illustrates a cross-sectional view of some alternative embodiments of transistor devices having an epitaxial layer disposed between an underlying recessed active region and an overlying gate dielectric layer.

FIG. 2 illustrates some alternative embodiments of a cross-sectional view 200 of transistor devices 201a, 201b having an epitaxial layer 202 disposed between an underlying recessed active region 104 and an overlying gate dielectric layer 110.

The epitaxial layer 202 has a compressive stress 208 that pushes inward on the epitaxial layer. The compressive stress 208 acts upon a channel region of the transistor devices 201a, 201b, thereby improving the performance of transistor devices 201a, 201b comprising PMOS transistor devices. For example, the compressive stress 208 may improve the mobility of PMOS transistor devices, thereby increasing the drain-source current $I_{DS}$ (since $I_{DS}=\frac{1}{2}\mu \cdot C_{ox} \cdot (W/L)(V_{GS}-V_t)^2$).

In some embodiments, the epitaxial layer 202 may comprise a single-layer epitaxial layer 204. For example, transistor device 201b comprises a single layer epitaxial layer 204. The single layer epitaxial layer 204 may comprise a layer of pure silicon epitaxially grown onto the semiconductor substrate 102. In some embodiments, the layer of pure silicon may have a thickness $t_1$ in a range of between approximately 3 nm and approximately 20 nm. In some embodiments, the layer of pure silicon may comprise a doped layer of silicon (e.g., having a p-type or n-type dopant concentration of between 1E18 cm$^{-3}$ and 1E21 cm$^{-3}$). In some embodiments, the single layer epitaxial layer 204 may comprise an additional semiconductor material such as germanium, for example.

In other embodiments, the epitaxial layer 202 may comprise a bi-layer epitaxial layer comprising a two epitaxial layers with different doping concentrations. For example, transistor device 201a comprises a bi-layer epitaxial layer with a first epitaxial layer 206a and a second epitaxial layer 206b. In some embodiments, the bi-layer epitaxial layer 206 may comprise a silicon cap layer 206a and an overlying doped silicon layer 206b. The silicon cap layer 206a may comprise an un-doped silicon layer, having a first thickness $t_1'$, which is disposed onto the active region 104. In some embodiments, the first thickness $t_1'$ may have a range of between approximately 3 nm and approximately 5 nm. The doped silicon layer 206b is disposed onto the silicon cap layer 206a and has a second thickness $t_2'$ greater than the first thickness $t_1'$. In some embodiments, the second thickness $t_2'$ may have a range of between approximately 10 nm and approximately 20 nm. The doped silicon layer 206b may have a doping concentration of a boron or carbon doping having a range of between approximately 1E18 cm$^{-3}$ and approximately 1E21 cm$^{-3}$.

Although the epitaxial layer 202 is illustrated in cross-sectional view 200 as a single layer epitaxial layer 204 and/or a bi-layer epitaxial layer 206, it will be appreciated that the disclosed epitaxial layer 202 is not limited to such layers. In other embodiments, the epitaxial layer 202 may comprise a multi-layer epitaxial layer (e.g., a tri-layer epitaxial layer, a quad layer epitaxial layer, etc.) having a plurality of epitaxial layers with different doping concentrations. In some embodiments, the epitaxial layer 202 may comprise a gradient doping concentration that increases or decreases as a function of a distance from a top surface of the epitaxial layer 202.

Figure 3:
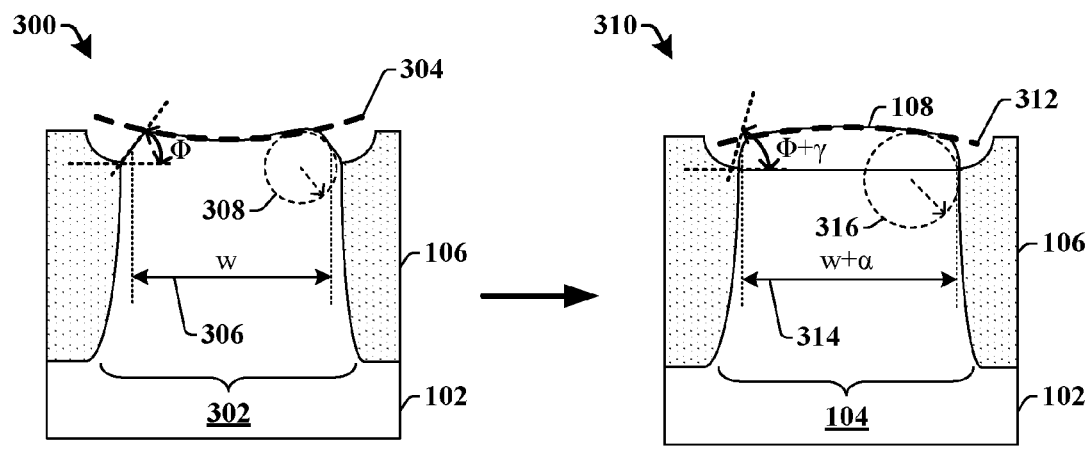
FIG. 3 illustrates a cross-sectional view of a transistor device having a non-recessed active region and a cross-sectional view of a transistor device having an epitaxial layer disposed over a recessed active region, in accordance with some embodiments of the disclosure.

FIG. 3 illustrates a cross-sectional view 300 of a transistor device having a non-recessed active region 302 and a cross-sectional view 310 of a transistor device having an epitaxial layer 108 disposed over a recessed active region 104, in accordance with some embodiments of the disclosure.

As shown in cross-sectional view 300, the non-recessed active region 302 has a concave curvature (extending along concave line 304) having a top surface that is higher at the outer edges of the non-recessed active region 302 and lower at a center of the non-recessed active region 302. Side surfaces of the non-recessed active region 302 have a sidewall angle Φ that is approximately 30° with respect to a horizontal plane. The non-recessed active region 302 has corners located between the side surfaces and a top surface of the non-recessed active region 302. The corners have a corner rounding radius 308.

As shown in cross-sectional view 310, the epitaxial layer 108 has a convex curvature (extending along convex line 312) having a top surface that is higher at a center of the epitaxial layer 108 and lower at the outer edges of the epitaxial layer 108. The convex curvature is due to the compressive stress (e.g., 208 in FIG. 2) on the epitaxial layer 108, which pushes the epitaxial layer 108 inward (and therefore pushes the center of the epitaxial layer 108 to a greater height than the outer edges of the epitaxial layer 108).

The epitaxial layer 108 has corners located between the side and top surfaces of the epitaxial layer 108. The corners have a corner rounding radius 316 that is greater than the corner rounding radius 308. For example, an active region may experience an increase in corner rounding having a value of between approximately 5% and approximately 30% of the width of the active region. The larger corner rounding radius causes an increase in the effective channel-width (e.g., by between approximately 10% to approximately 30%), which improves device performance (e.g., source-drain current, $I_{ds}$).

The side surfaces of the epitaxial layer 108 have a sidewall angle Φ+γ that is greater than approximately 30° with respect to a horizontal plane. For example, in some embodiments, the epitaxial layer 108 at an angle that is equal to approximately 54.7° (i.e., a (111) facet) with respect to a horizontal plane along a top of an isolation structure 106. The larger sidewall angle improves the uniformity of an overlying gate dielectric layer, since the larger sidewall angle decreases thinning of the gate dielectric layer due to subsequent etching processes.

Figure 4:
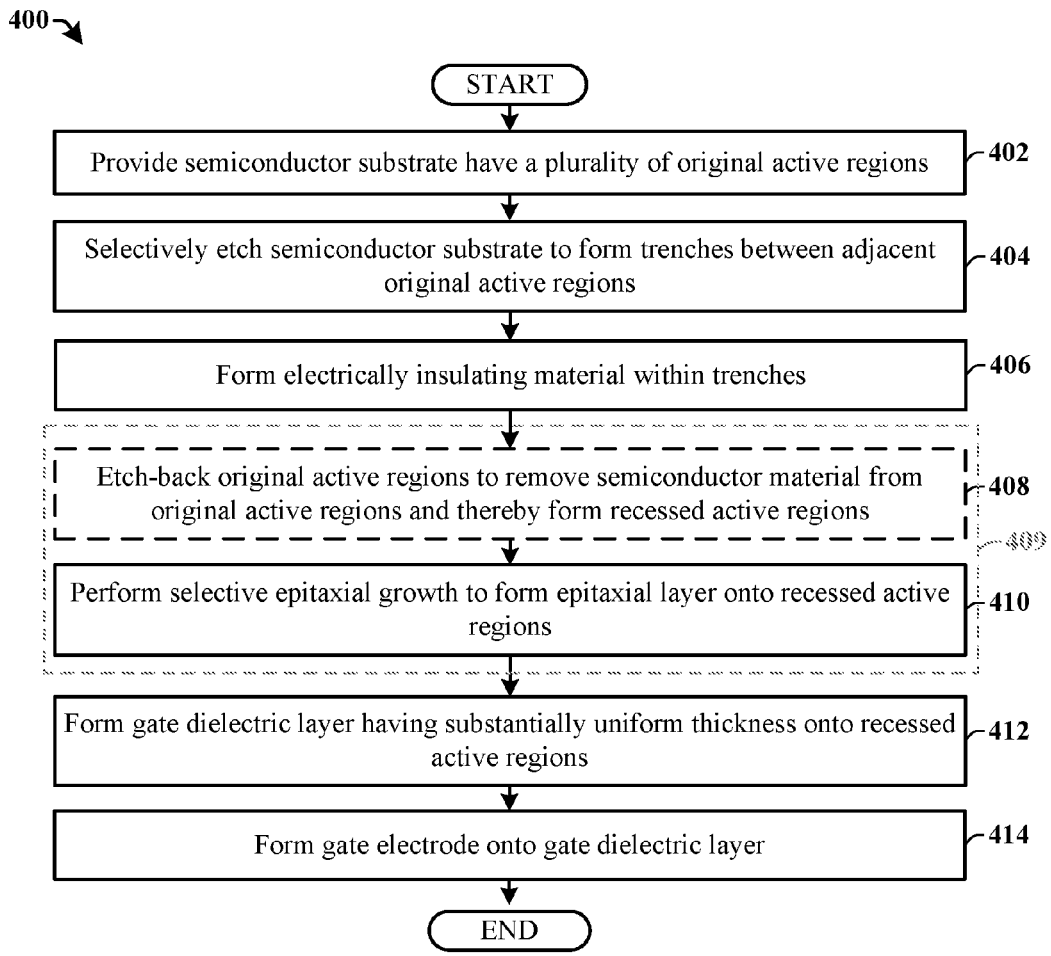
FIG. 4 illustrates a method of forming a transistor device having an epitaxial layer disposed between an underlying recessed active region and an overlying gate dielectric layer in accordance with some embodiments of the disclosure.

FIG. 4 illustrates a method 400 of forming a transistor device having an epitaxial layer disposed between an underlying recessed active region and an overlying gate dielectric layer in accordance with some embodiments of the disclosure.

While disclosed methods (e.g., 400 and/or 1000) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor substrate having a plurality of original active regions is provided. The original active regions comprise source and drain regions that are doped opposite that of a body region or a well region in a surrounding semiconductor substrate.

At 404, the semiconductor substrate is selectively etched to form trenches between adjacent original active regions. In some embodiments, the semiconductor substrate may be etched according to a hard mask disposed over the semiconductor substrate.

At 406, the trenches are filled with an electrically insulating material to form an isolation structure between adjacent original active regions. The isolation structure (e.g., STI) is configured to electrically isolate adjacent original active regions so that they do not interfere with each others' operations.

At 408, the original active regions may be etched back to remove a top portion of the original active region and thereby form recessed active regions. In some embodiments, the etch back process may be performed by a plasma etching process. The resulting recessed active regions have a top surface that is below the surrounding isolation structures.

At 410, a selective epitaxial growth is performed to form an epitaxial layer onto the recessed active regions. The epitaxial layer may be grown onto the recessed active regions by way of a deposition technique (e.g., chemical vapor deposition). For example, in some embodiments, the epitaxial layer may be formed by a LPVCD (low-pressure chemical vapor deposition) process. In other embodiments, the epitaxial layer may be formed by an APCVD (atmospheric pressure chemical vapor deposition) process.

In various embodiments, the epitaxial layer may comprise a single-layer epitaxial layer or bi-layer epitaxial layer. The single layer epitaxial layer may comprise a layer of pure silicon epitaxially grown onto the recessed active regions. The bi-layer epitaxial layer comprises an un-doped silicon cap layer grown onto the recessed active regions and a doped silicon layer grown onto the un-doped silicon cap layer. The doped silicon layer may have a doping concentration of a boron, a phosphorus, or carbon doping having a range of between approximately 1E18 $cm^{-3}$ and approximately 1E21 $cm^{-3}$.

In some embodiments, the etch back process (act 408) and the epitaxial growth process (act 410) are performed in-situ (as shown by box 409), within a same processing chamber (i.e., without removing the semiconductor substrate from the processing chamber).

At 412, a gate dielectric layer is formed over the epitaxial layer.

At 414, a gate electrode is formed over the gate dielectric layer.

FIGS. 5-8 illustrate cross-sectional views of various stages of forming a transistor device in accordance with some embodiments of the disclosure. Although FIGS. 5-8 are described in relation to method 400, it will be appreciated that the structures disclosed in FIGS. 5-8 are not limited to such a method.

Figure 5:
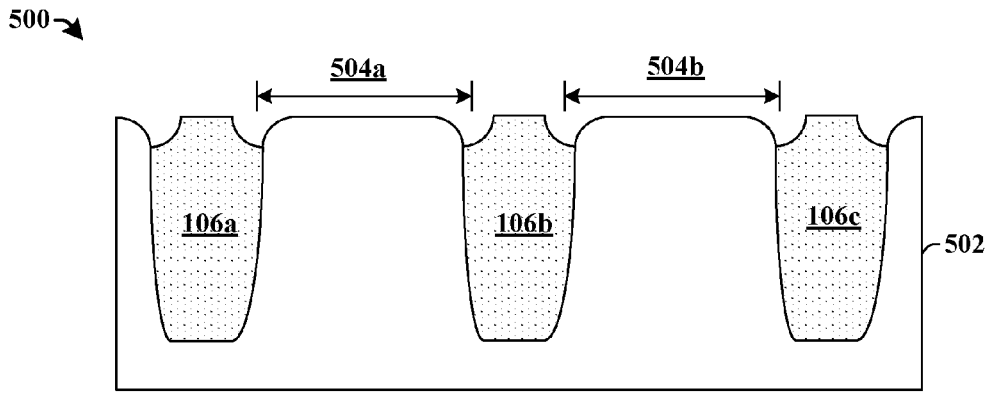
FIGS. 5-8 illustrate cross-sectional views of various stages of forming a transistor device in accordance with some embodiments of the disclosure.

FIG. 5 illustrates a cross-sectional view 500 of some embodiments of a semiconductor substrate corresponding to acts 402-404.

As shown in cross-sectional view 500, a plurality of isolation structures 106a-106c are formed in the semiconductor substrate 502 at positions that separate adjacent original active regions 504a, 504b. In some embodiments, the isolation structures 106a-106c may comprise a shallow trench isolation (STI) regions. The STI regions may be formed by selectively etching a shallow trench within the semiconductor substrate 502 at positions between adjacent original active regions 504a, 504b. The shallow trench is subsequently filled with a dielectric material to provide electrical isolation between the adjacent original active regions 504a, 504b. The semiconductor substrate 502 may be planarized after formation of the isolation structures 106a-106c to remove excess dielectric material from a surface of the semiconductor substrate 502.

In some embodiments, the dielectric material may comprise silicon dioxide ($SiO_2$). In other embodiments, the dielectric material may comprise such materials as $ZrO_2$, $Al_2O_3$, high density plasma (HDP) oxide, or combinations thereof. In some embodiments, a high temperature anneal may be performed to increase the density of the dielectric material within the isolation structures 106a-106c.

Figure 6:
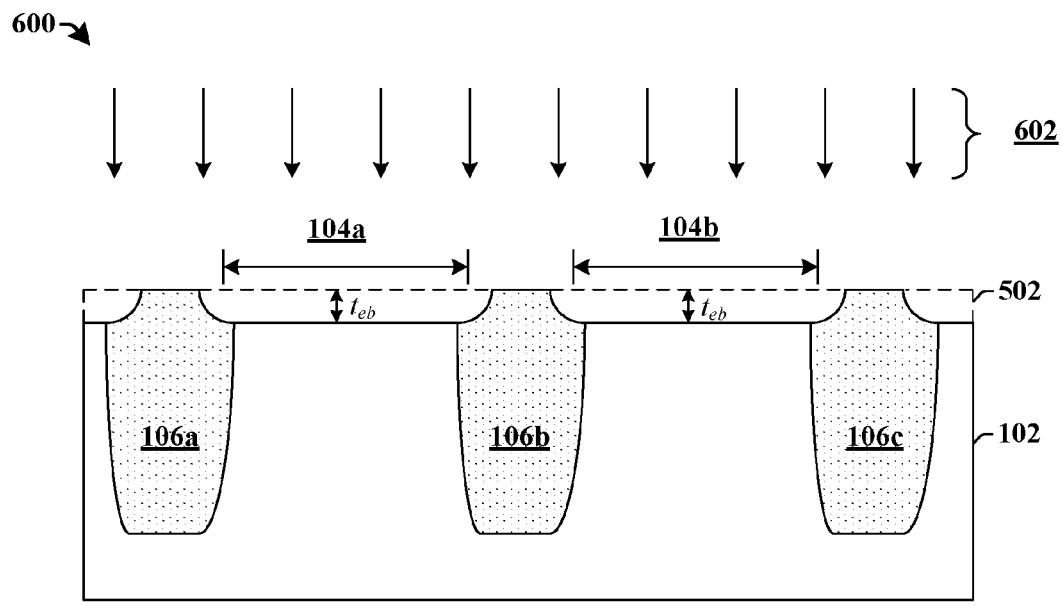

FIG. 6 illustrates a cross-sectional view 600 of some embodiments of a substrate corresponding to act 406.

As shown in cross-sectional view 600, the semiconductor substrate 102 is exposed to an etchant 602 that removes a portion of the original active regions 504a, 504b (i.e., etches back the original active regions 504a, 504b) to form recessed active regions 104a, 104b. The etch-back process removes unwanted topographical features from the surface of the original active regions 504a, 504b. The etch-back process may use an etchant 602 having a selectivity that removes a portion of the original active regions without changing corner profiles of the isolation structures 106a-106c (e.g., STI regions). Since a high surface roughness of the original active regions 504a, 504b may adversely affect a thickness of an overlying gate dielectric layer, etching back the original active regions 504a, 504b and growing the epitaxial layer in its place (act 408) can reduce the surface roughness (e.g., a haze value can be reduced by between 0% and 50%).

In some embodiments, the etchant 602 may comprise a plasma etchant formed using processing gases comprising a hydrogen ($H_2$) gas and a hydrochloric acid (HCl) gas. In some additional embodiments, the etchant 602 may further use a processing gas mixture having 1% germane ($GeH_4$) and 99% $H_2$ gases to enhance the etching rate of the etchant 602. In some embodiments, the portion of the original active regions 504a, 504b removed may have a thickness $t_{eb}$ having a range of between approximately 5 nm and approximately 10 nm.

Figure 7:
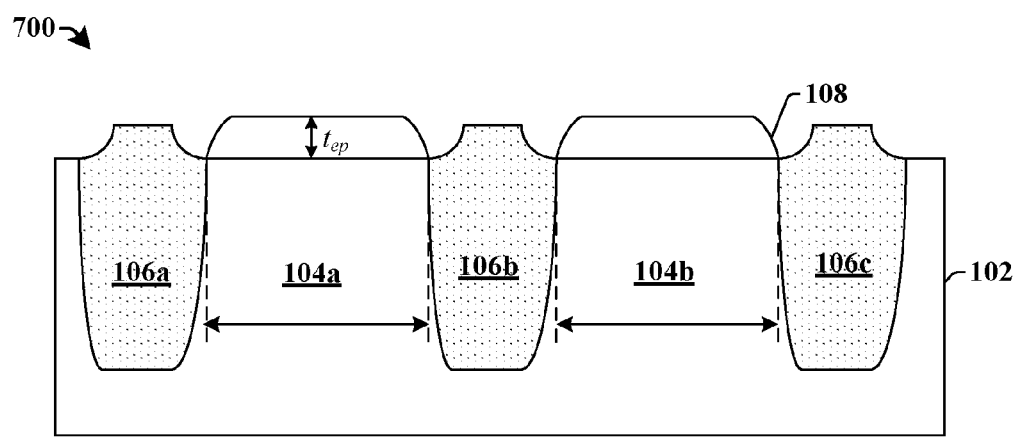

FIG. 7 illustrates a cross-sectional view 700 of some embodiments of a substrate corresponding to act 408.

As shown in cross-sectional view 700, an epitaxial layer 108 is formed onto the recessed active regions 104a, 104b. The epitaxial layer 108 is grown using a selective epitaxial growth process that forms the epitaxial layer 108 at a position between the isolation structures 106a-106c. In other words, the selective epitaxial growth process forms the epitaxial layer 108 onto the recessed active regions 104a, 104b, but does not form the epitaxial layer 108 onto the isolation structures 106a-106c (e.g., the STI regions). For example, in some embodiments, the epitaxial layer 108 may be grown by an epitaxial growth process that uses processing gases comprising a hydrogen ($H_2$) gas and a hydrochloric acid (HCl) gas. Such processing gases will act to prevent formation of the epitaxial layer 108 on the isolation structures 106a-106c, while allowing for the formation of the epitaxial layer 108 on the active regions 104a, 104b.

In some embodiments, the epitaxial layer 108 is grown to a height $t_{ep}$ that is greater than a height $t_{eb}$ of the etch back (act 406). For example, in some embodiments, the etch back may remove 5 nm of the original active regions 504a, 504b, while the subsequent epitaxial growth may form an epitaxial layer 108 comprising 5 nm of pure epitaxial silicon onto the recessed active regions 104a, 104b. In other embodiments, the epitaxial layer may be grown to a height that is larger or smaller than a height $t_{eb}$ of the etch back.

Figure 8:
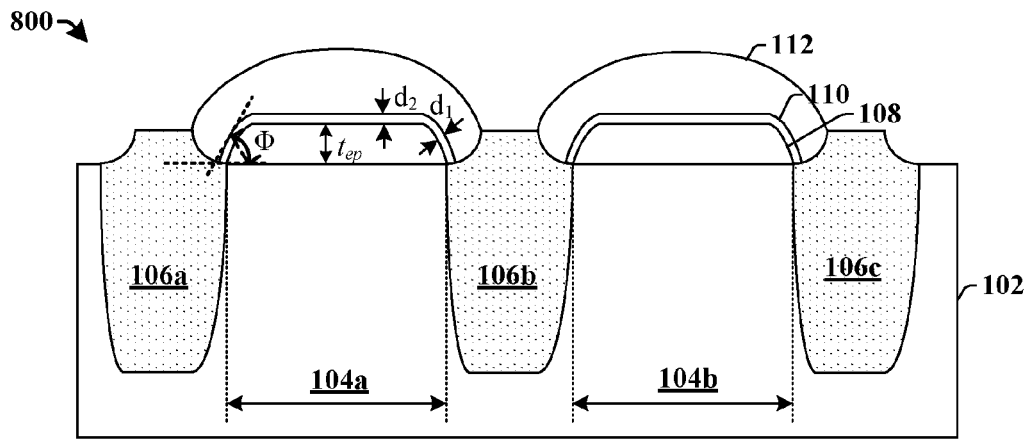

FIG. 8 illustrates a cross-sectional view 800 of some embodiments of a substrate corresponding to act 410.

As shown in cross-sectional view 800, a gate dielectric layer 110 having a substantially uniform thickness is formed over the epitaxial layer 108. In some embodiments, the gate dielectric layer 110 is deposited onto sidewalls of the epitaxial layer 108 at an angle Φ that is greater than 30° with respect to a horizontal plane. In some embodiments, the angle Φ may comprise a normal silicon (111) facet of 54.7° with respect to a horizontal plane. A gate electrode 112, configured to control the flow of charge carriers within a channel region in the epitaxial layer 108 extending between the source region 116 and the drain region 118, is subsequently formed at a position overlying the gate dielectric layer 110.

In some embodiments, the gate electrode 112 may comprise a polysilicon gate. The polysilicon gate may be formed by selectively depositing polysilicon on a surface of the semiconductor substrate between the source and drain regions. In some embodiments, the polysilicon may be deposited using a chemical vapor deposition technique (e.g., LPCVD). In some embodiments, selectively portions of the deposited polysilicon material may be subsequently removed according to a masking layer.

Figure 9:
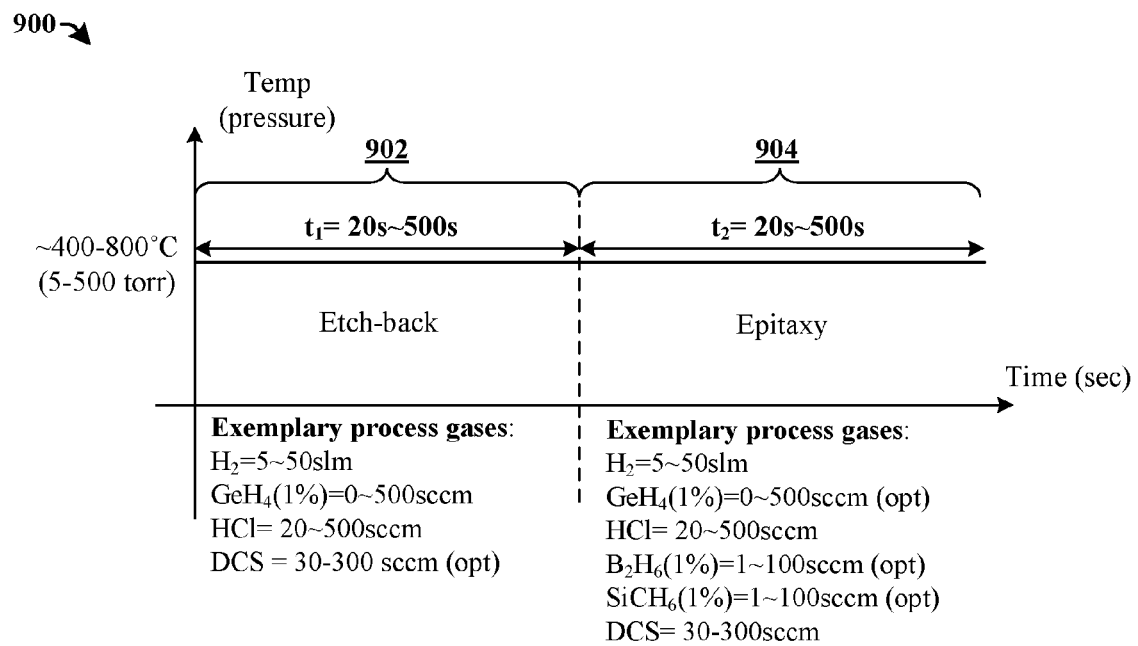
FIG. 9 illustrates a timing diagram corresponding to a method of forming a transistor device in accordance with some embodiments of the disclosure.

FIG. 9 illustrates a timing diagram 900 corresponding to a method of forming a transistor device (e.g., method 400), having an epitaxial layer disposed between an underlying recessed active region and an overlying gate dielectric layer, in accordance with some embodiments of the disclosure.

As shown in timing diagram 900, a first processing step 902 is performed to etch back a portion of an original active region of a semiconductor substrate to form a recessed active region. The etch back process is performed within a processing chamber held at a temperature in a range of between approximately 400° C. and approximately 800° C. and at a pressure having a range of between approximately 5 torr and approximately 500 torr. In some embodiments, the etch back process may use processing gases comprising a hydrogen ($H_2$) gas and a hydrochloric acid (HCl) gas. In some additional embodiments, the etch back process may use a processing gas comprising a germane ($GeH_4$) gas or DCS (dichlorosilane).

In some embodiments, the $H_2$ gas may be introduced into the processing chamber at a flow rate having a range of between approximately 5 and approximately 50 slm (standard liter per minute). In some embodiments, the $GeH_4$ (1%) gas may be introduced into the processing chamber at a flow rate having a range of between approximately 0 sccm and approximately 500 sccm (standard cubic centimeter per minute). In some embodiments, the HCl gas may be introduced into the processing chamber at a flow rate having a range of between approximately 20 sccm and approximately 500 sccm.

As shown in timing diagram 900, a subsequent second processing 904 step is performed to selectively grow an epitaxial layer on the recessed active region. In various embodiments, the epitaxial layer may comprise an un-doped silicon epitaxial layer and/or a doped silicon epitaxial layer. In some embodiments, the epitaxial layer may be formed using a multi-step epitaxial process to form a multi-layer epitaxial layer having a silicon cap layer and an overlying silicon boron (SiB) layer.

In some embodiments, the selective epitaxial growth process may use processing gases comprising a hydrogen ($H_2$) gas, dichloro-silane (DCS) a germane ($GeH_4$) gas, and/or a hydrochloric acid (HCl) gas. In some embodiments, the $H_2$ gas may be introduced into the processing chamber at a flow rate having a range of between approximately 5 slm and approximately 50 slm. In some embodiments, the $GeH_4$ (1%) gas may be introduced into the processing chamber at a flow rate having a range of between approximately 0 sccm and approximately 500 sccm. In some embodiments, the DCS gas may be introduced into the processing chamber at a flow rate having a range of between approximately 30 sccm and approximately 300 sccm. In other embodiments, silane ($SiH_4$), disilane ($Si_2H_6$) or trisilane ($Si_3H_8$) may be used as a Silicone precursor. In some embodiments, the HCl gas may be introduced into the processing chamber at a flow rate having a range of between approximately 20 sccm and approximately 500 sccm.

In some embodiments, wherein a doped epitaxial layer is formed, additional processing gases may also be used to introduce a doping into the epitaxial layer. For example, in some embodiments, the epitaxial growth process may use processing gases comprising a boron source gas such as diborane $B_2H_6$ and/or a carbon source gas such as $SiH_3CH_3$. In some embodiments, $B_2H_6$ gas may be introduced into the processing chamber at a flow rate having a range of between approximately 1 sccm and approximately 100 sccm. In some embodiments, $SiH_3CH_3$ gas may be introduced into the processing chamber at a flow rate having a range of between approximately 1 sccm and approximately 100 sccm.

In some embodiments, the first processing step 902 (etch back process) and the second processing step 904 (selective epitaxial growth process) may be performed at a same temperature and pressure. For example, the first processing step 902 and the second processing step 904 may be performed within a processing chamber held at a temperature in a range of between approximately 400° C. and approximately 800° C. and at a pressure having a range of between approximately 5 torr and approximately 500 torr.

In various embodiments, the provided subject matter may be applied to planner logic CMOS devices, Fin-FET logic devices, and/or embedded flash, DRAM, MEMS and CMOS image sensor devices. For example, the disclosed epitaxial re-growth can increase the effective channel width for an embedded flash memory cell to improve program and erase performances. In addition, the provided subject matter may be used with a vertical transfer gate transistor in a CMOS image sensor (CIS), as provided below.

Figure 10A:
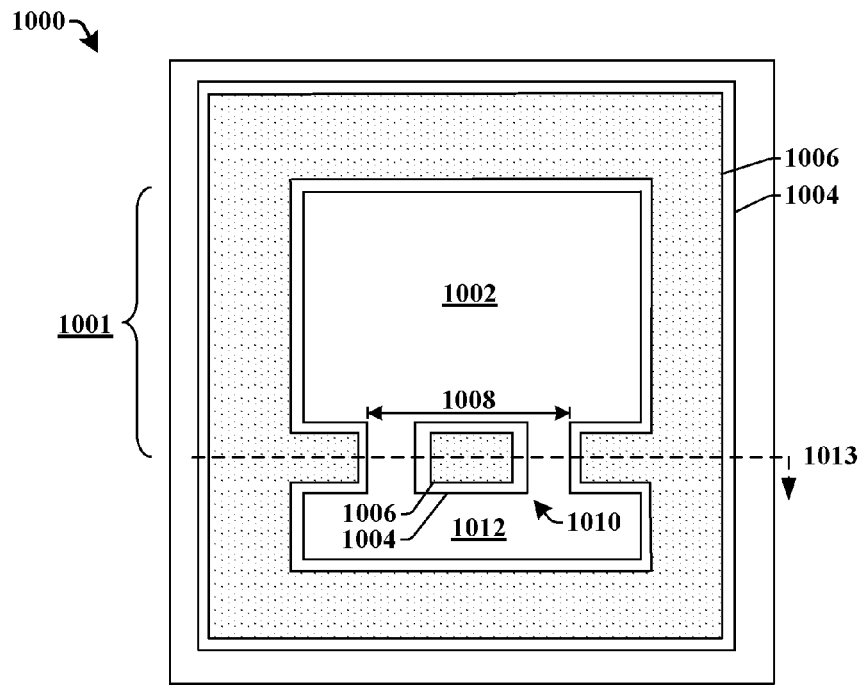
FIGS. 10A-10B illustrate some embodiments of a transfer transistor having a vertical transfer gate.
Figure 10B:
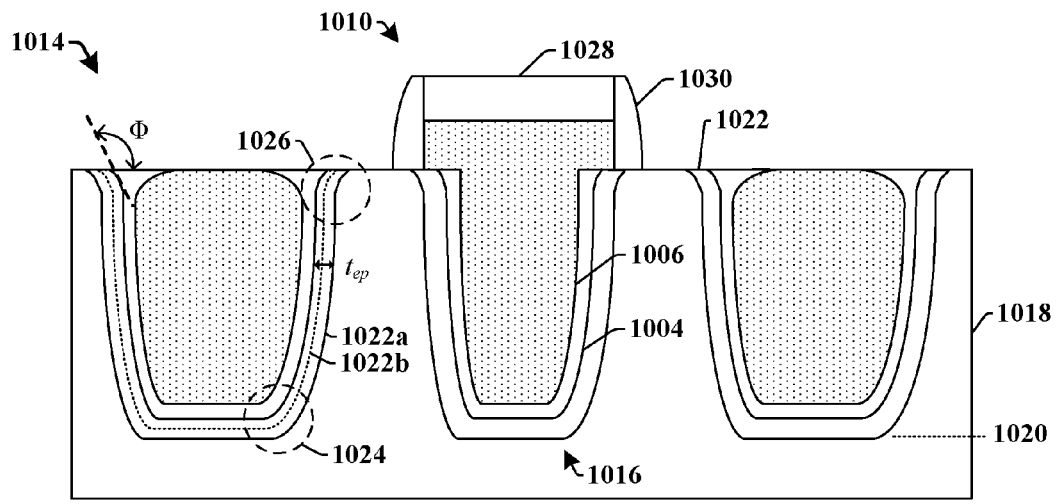

FIGS. 10A-10B illustrate some embodiments of a transfer transistor having a vertical transfer gate disposed within a trench having one or more epitaxial layers 1022.

FIG. 10A is a plan view of a CMOS image sensor (CIS) comprising a pixel 1000.

The pixel 1000 comprises a rectangular photodiode region 1002 and a charge collection region 1012. In some embodiments, the rectangular photodiode region 1002 comprises a semiconductor substrate surrounded by a trench comprising an electrically insulating layer 1004 and a surrounding conductive gate material 1006. There is an opening 1008 in the trench along one side of the photodiode region 1002. A transfer transistor having a vertical charge transfer gate 1010 is disposed within the opening 1008. The transfer transistor having the vertical charge transfer gate 1010 is configured to allow charges that have accumulated within the photodiode region 1002 to be transfer to the charge collection region 1012 (e.g., a floating diffusion node), which is surrounded by a rectangular extension of the trench 202 comprising the electrically insulating layer 1004 and the conductive gate material 1006. For example, when a positive voltage is applied to the vertical charge transfer gate 1010, charges are transferred from the photodiode region 1002 to the charge collection region 1012.

FIG. 10B illustrates a cross-sectional view 1014 (along line 1013 of FIG. 10A) of CIS pixel 1000.

As shown in cross-sectional view 1014, the vertical charge transfer gate 1010 is disposed within a trench 1016 in a semiconductor substrate 1018. The vertical charge transfer gate 1010 extends from a top surface of the semiconductor substrate 1018 to a depth 1020 within the semiconductor substrate 1018.

One or more epitaxial layers 1022 are disposed along interior sidewalls and the bottom surface of the trenches 1016. In some embodiments, the one or more epitaxial layers 1022 may have a thickness $t_{ep}$ having a range of between approximately 4 nm and approximately 10 nm. In other embodiments, the thickness $t_{ep}$ of the one or more epitaxial layers 1022 may be larger or smaller. In various embodiments, the epitaxial layers 1022 may comprise a single-layer epitaxial layer, a multi-layer epitaxial layer comprising a plurality of epitaxial layers (e.g., 2 or more epitaxial layers) with different doping types, or an epitaxial layer having a gradient doping concentration. For example, in some embodiments, the multi-layer epitaxial region may comprise a bi-layer epitaxial layer comprising a first epitaxial layer 1022a and a second epitaxial layer 1022b.

The one or more epitaxial layers 1022 provide the vertical transfer gate transistor with a number of advantages. For example, the one or more epitaxial layers 1022 improve the surface roughness of the interior surfaces of the trenches 1016 (e.g., the trench sidewalls and bottom surface) relative to the surface roughness of the semiconductor substrate 1018. Furthermore, the one or more epitaxial layers 1022 increase the corner rounding profiles (e.g., by between 50% and 200%) at lower corners 1024 and upper corners 1026 of the trenches 1016.

The electrically insulating layer 1004 is disposed within the trench 1016 at a position over the epitaxial layers 1022 on the bottom surface and sidewalls of the trench 1016. In some embodiments, the increased corner rounding profiles at lower corners 1024 and upper corners 1026 provide for an angle Φ at an interface between the one or more epitaxial layer 1022 and the electrically insulating layer 1004, which is greater than 50° with respect to the top surface of the semiconductor substrate 1018. The conductive gate material 1006 is disposed within the trench within the trench 1016 at a position that is separated from the one or more epitaxial layers 1022 by the electrically insulating layer 1004. In some embodiments, the conductive gate material 1006 may comprise polysilicon, while the electrically insulating layer 1004 may comprise an oxide (e.g., $SiO_2$).

The conductive gate material 1006 forms a gate structure of the vertical charge transfer gate 1010 that extends to a position overlying the semiconductor substrate 1018. In some embodiments, the gate structure comprises a silicide layer 1028 disposed over the conductive gate material 1006 of the vertical charge transfer gate 1010. In some embodiments, the conductive gate material 1006 overlying the semiconductor substrate 1018 may be flanked by sidewall spacers 1030. In some embodiments, the sidewall spacers 1030 may comprise nitride spacers. One or more metal interconnect layers (not shown) may be located above silicide layer 1028.

Figure 11:
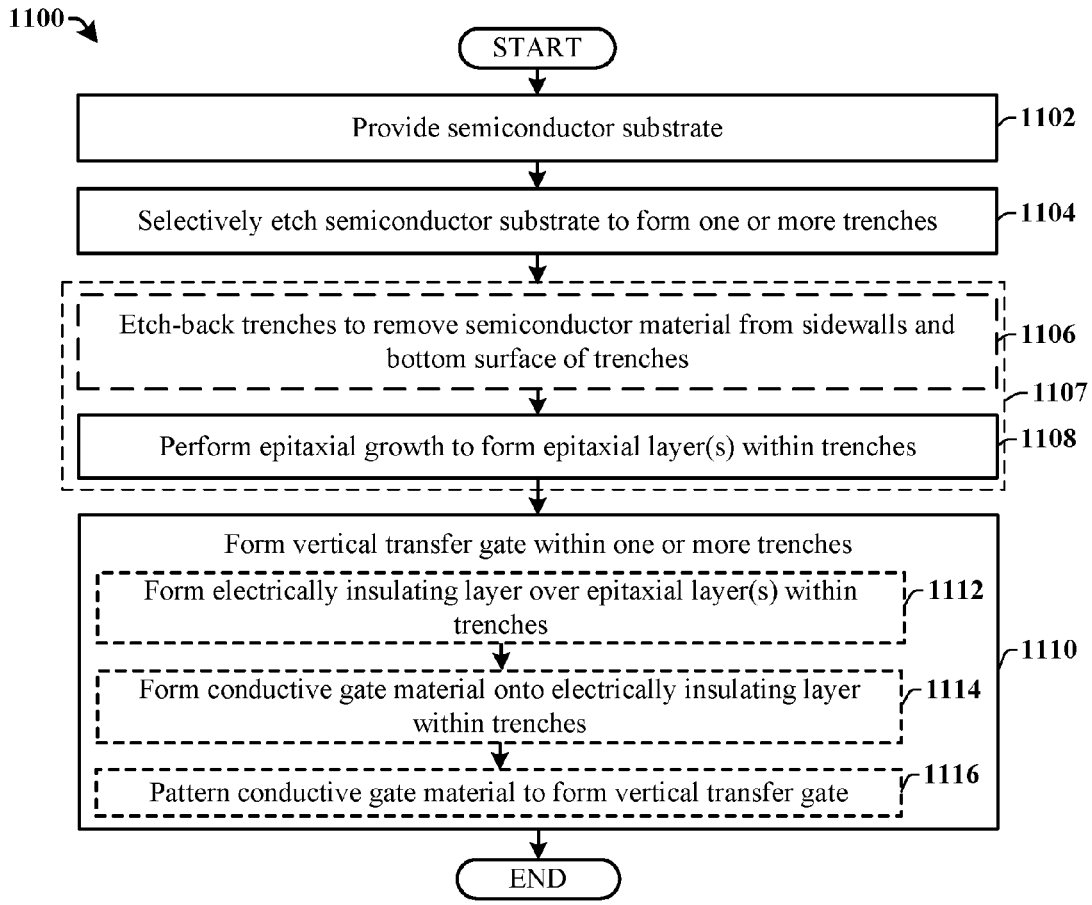
FIG. 11 illustrates a method of forming a CIS (CMOS image sensor) pixel comprising a transistor device having an epitaxial layer disposed between vertical transfer gates.

FIG. 11 illustrates a method 1100 of forming a CIS (CMOS image sensor) pixel comprising a transistor device having one or more epitaxial layers formed within a trench comprising a recessed vertical gate.

At 1102, a semiconductor substrate is provided. In some embodiments, the semiconductor substrate may comprise a plurality of active regions. The active regions comprise source and drain regions that are doped opposite that of a body region or a well region in a surrounding semiconductor substrate.

At 1104, the semiconductor substrate is selectively etched to form one or more trenches. In some embodiments, a patterned hard mask layer may be formed over the semiconductor substrate prior to etching. The patterned hard mask layer is configured to mask the semiconductor substrate from the etchant, so as to protect un-etched sections the semiconductor substrate and to define a location of the one or more trenches. In some embodiments, the one or more trenches may be formed between adjacent active regions covered by the patterned hard mask layer.

At 1106, the interior surfaces of the trenches may be etched back to remove a top portion of the substrate within the trenches. In some embodiments, etching back the interior surfaces of the trenches may remove between approximately 1 nm and approximately 5 nm of material from the interior surfaces of the trenches. In some embodiments, the etch back process may comprise a plasma etching process.

At 1108, an epitaxial growth is performed to form one or more epitaxial layers onto the sidewalls and bottom surfaces of one or more of the trenches. In some embodiments, the one or more epitaxial layers are formed onto the sidewalls and bottom surfaces of the recessed trenches. The epitaxial layer may be grown by way of a deposition technique (e.g., chemical vapor deposition). For example, in some embodiments, the one or more epitaxial layers may be formed by a LPVCD (low-pressure chemical vapor deposition) process. In other embodiments, the one or more epitaxial layers may be formed by an APCVD (atmospheric pressure chemical vapor deposition) process.

In some embodiments, the etch back process (act 1106) and the epitaxial growth process (act 1108) are performed in-situ (as shown by box 1107), within a same processing chamber (i.e., without removing the semiconductor substrate from the processing chamber).

At 1110, a vertical transfer gate is formed within one or more of the trenches. In some embodiments, the vertical transfer gate is formed by forming an electrically insulating layer onto the one or more epitaxial layers within the one or more trenches, at 1112. At 1114, a conductive gate material is formed onto the electrically insulating layer at a position within the one or more trenches. In other words, the conductive gate material is separated from the substrate and the epitaxial layer(s) by the electrically insulating layer. At 1116, the conductive gate material is selectively patterned to form a vertical transfer gate extending from within a trench to a position overlying the semiconductor substrate.

Therefore, method 1100 forms epitaxial layers within one or more trenches comprising a vertical transfer gate transistor. By forming the epitaxial layers within one or more trenches comprising a vertical transfer gate, the side-wall roughness and top/bottom corner rounding profile of the trenches are improved relative to that of conventional vertical gate transistors. The smoother side-wall and better corner-rounding profile provide for higher-performance CIS applications.

FIGS. 12-16 illustrate cross-sectional views of various stages of forming a CIS pixel having a transfer transistor with a vertical transfer gate in accordance with some embodiments of the disclosure. Although FIGS. 12-16 are described in relation to method 1100, it will be appreciated that the structures disclosed in FIGS. 12-16 are not limited to such a method, but instead may stand alone as apparatus.

Figure 12:
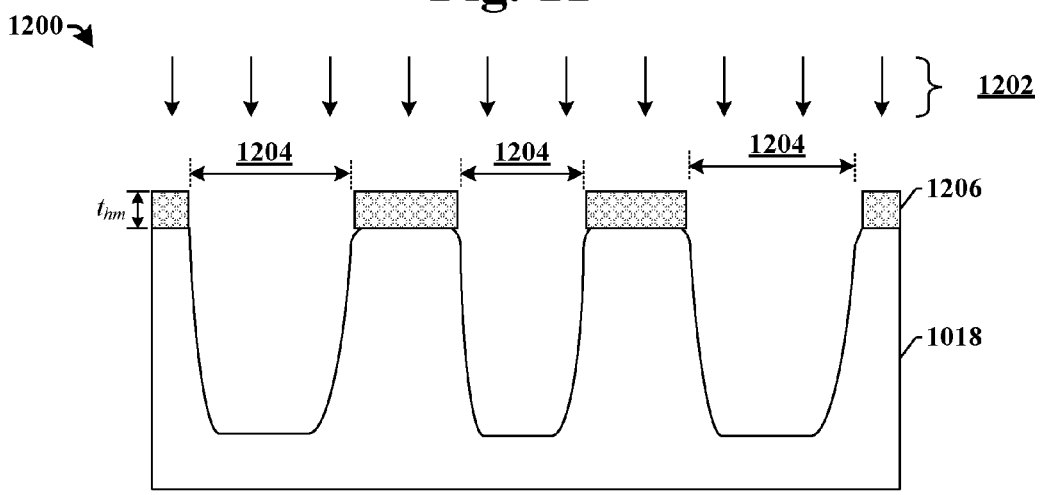
FIGS. 12-16 illustrate cross-sectional views of various stages of forming a CIS pixel having a transistor device with a vertical transfer gate in accordance with some embodiments of the disclosure.

FIG. 12 illustrates a cross-sectional view 1200 of some embodiments of a semiconductor substrate corresponding to acts 1102-1104.

As shown in cross-sectional view 1200, a semiconductor substrate 1018 is selectively exposed to an etchant 1202. The etchant 1202 is configured to form a plurality of trenches 1204 within the semiconductor substrate 1018. In some embodiments, the plurality of trenches 1204 are disposed between active regions in the semiconductor substrate 1018.

In some embodiments, a patterned hard mask layer 1206 is formed onto the semiconductor substrate 1018. The patterned hard mask layer 1206 comprises a plurality of openings that define the positions of the plurality of trenches 1204. In some embodiments, the patterned hard mask layer 1206 is formed over active areas of the substrate 1018. In such embodiments, the patterned hard mask layer 1206 is configured to protect the active areas from etchants (e.g., acts 1104-1106) and from epitaxial processes (e.g., act 1108). In some embodiments, the patterned hard mask layer 1206 may comprise an oxide or a nitride layer. In some embodiments, the patterned hard mask layer 1206 may have a thickness $t_{hm}$ having a range of between approximately 10 nm and 100 nm.

Figure 13:
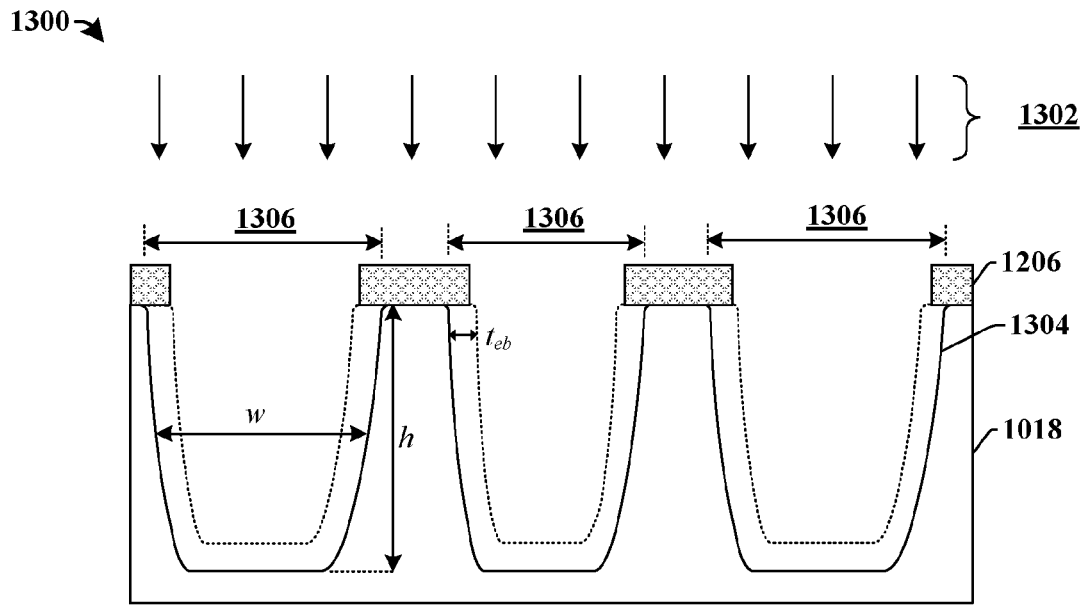

FIG. 13 illustrates a cross-sectional view 1300 of some embodiments of a semiconductor substrate corresponding to act 1106.

As shown in cross-sectional view 1300, the semiconductor substrate 1018 is exposed to an etchant 1302 that removes a portion of the substrate 1304 from within the interior surfaces of the trenches 1204. In some embodiments, the etchant 1302 may comprise a dry etchant formed by a dry etching process performed in a processing chamber held at a pressure of between approximately 5 torr and approximately 50 torr and at a temperature of between approximately 400° and approximately 800°, for a time of between approximately 20 seconds and approximately 500 seconds.

The resulting recessed trenches 1306 have a greater width w and height h than trenches 1204. By removing the portion of the substrate 1304, the etchant 1302 removes unwanted topographical features from the interior surfaces of the trenches 1204. In some embodiments, the portion of the substrate 1304 removed may have a thickness $t_{eb}$ having a range of between approximately 1 nm and approximately 5 nm.

Figure 14:
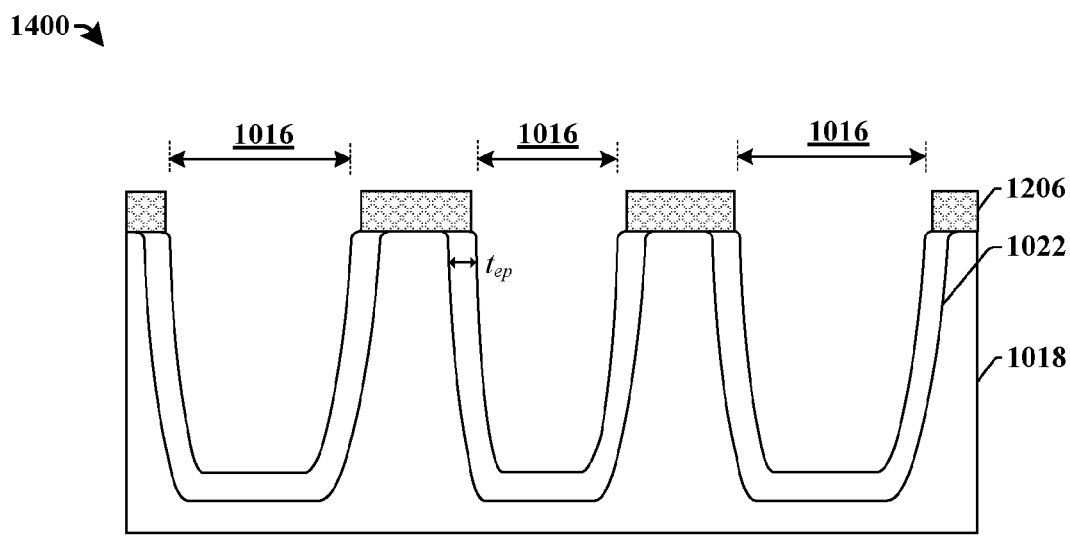

FIG. 14 illustrates a cross-sectional view 1400 of some embodiments of a semiconductor substrate corresponding to act 1108.

As shown in cross-sectional view 1400, one or more epitaxial layers 1022 are formed within the recessed trenches 1306. The one or more epitaxial layers 1022 may be formed to a thickness $t_{ep}$ that is greater than the thickness $t_{eb}$. For example, in some embodiments, the one or more epitaxial layers 1022 may have a thickness $t_{ep}$ having a range of between approximately 5 nm and approximately 15 nm. In some embodiments, the one or more epitaxial layers 1022 may be formed by a deposition process performed in a processing chamber held at a pressure of between approximately 5 torr and approximately 50 torr and at a temperature of between approximately 400° and approximately 800°, for a time of between approximately 20 seconds and approximately 1000 seconds.

In various embodiments, the one or more epitaxial layers 1022 may comprise a single-layer epitaxial layer or bi-layer epitaxial layer. The single layer epitaxial layer may comprise a layer of pure silicon epitaxially grown onto the recessed active regions. The bi-layer epitaxial layer comprises an un-doped silicon cap layer grown onto the recessed active regions and a doped silicon layer grown onto the un-doped silicon cap layer. The doped silicon layer may have a doping concentration of a boron, a phosphorus, or carbon doping having a range of between approximately $1E18 \text{ cm}^{-3}$ and approximately $1E21 \text{ cm}^{-3}$.

In some embodiments, after the one or more epitaxial layers 1022 are formed within the recessed trenches 1306, the hard mask layer 1206 can be removed from the semiconductor substrate 1018.

Figure 15:
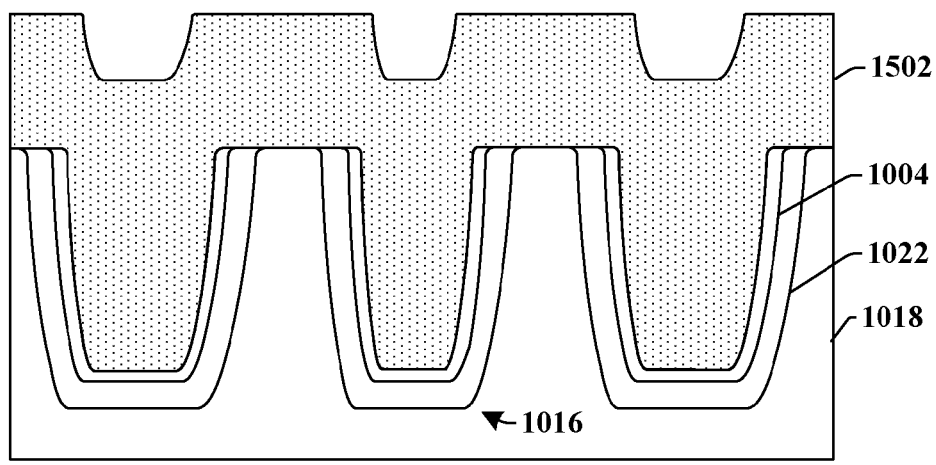

FIG. 15 illustrates a cross-sectional view 1500 of some embodiments of a semiconductor substrate corresponding to acts 1012-1014.

As shown in cross-sectional view 1500, an electrically insulating layer is formed onto the one or more epitaxial layers 1022 within the trenches 1016. A conductive gate material 1502 is then deposited over a top surface of the semiconductor substrate 1018 and within the trenches 1016 at positions overlying the electrically insulating layer 1004. The conductive gate material 1502 fills the trenches 1016. In some embodiments, the conductive gate material 1502 may comprise polysilicon, while the electrically insulating layer 1004 may comprise an oxide (e.g., $SiO_2$).

Figure 16:
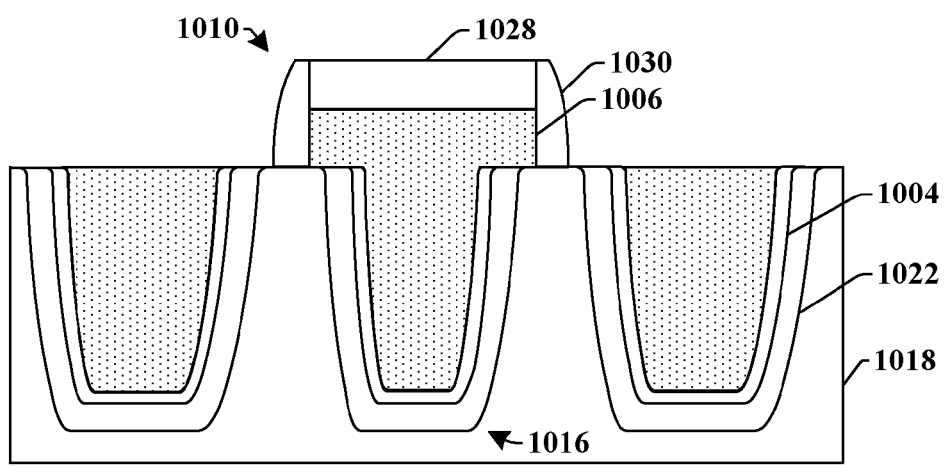

FIG. 16 illustrates a cross-sectional view 1600 of some embodiments of a semiconductor substrate corresponding to act 1016.

As shown in cross-sectional view 1600, the conductive gate material 1502 is planarized and selectively patterned to form a patterned conductive gate material 1006. In some embodiments, the conductive gate material 1502 may be planarized by way of a chemical mechanical polishing (CMP) process and then exposed to an etchant configured to remove unmasked parts of the conductive gate material 1502. In some embodiments, the etchant comprises a dry etchant used to selectively pattern the conductive gate material 1006 according to a hard mask. In some embodiments, a silicide layer 1028 may be formed over the patterned conductive gate material 1006. In various embodiments, the silicide layer 1028 may comprise an oxide or silicon nitride material deposited by a deposition technique. In some embodiments, sidewall spacers 1030 may be formed on opposing sides of the patterned conductive gate material 1006 and the silicide layer 1028. In some embodiments, the sidewall spacers 1030 may be formed by depositing nitride onto the semiconductor substrate 1018 and selectively etching the nitride to form the sidewall spacers 1030.

Therefore, the present disclosure relates a transistor device having an epitaxial layer disposed over a recessed active region, and an associated method of formation. The epitaxial layer is configured to improve transistor device performance.

In some embodiments, the present disclosure relates to a transistor device. The transistor device comprises an epitaxial layer disposed over a substrate between a source region and a drain region separated along a first direction. The transistor device further comprises isolation structures extending into the substrate on opposite sides of the epitaxial layer along a second direction, perpendicular to the first direction. The transistor device further comprises a gate dielectric layer disposed over the epitaxial layer, and a conductive gate electrode disposed over the gate dielectric layer.

In other embodiments, the present disclosure relates to a transistor device. The transistor device comprises a substrate, and an epitaxial layer disposed over the substrate and comprising a source region and a drain region separated by a channel region along a first direction. The epitaxial layer has an upper surface that is higher at a center than at rounded outer edges. The transistor device further comprises a gate dielectric layer disposed over the epitaxial layer, and a conductive gate electrode disposed over the gate dielectric layer.

In yet other embodiments, the present disclosure relates to a transistor device. The transistor device comprises a silicon epitaxial layer disposed over a silicon substrate between a source region and a drain region separated along a first direction. The silicon epitaxial layer has an upper surface that is higher at a center than at rounded outer edges. The transistor device further comprises a gate dielectric layer arranged onto the silicon epitaxial layer. The gate dielectric layer curves towards the silicon substrate along outer edges of the gate dielectric layer. The transistor device further comprises a conductive gate electrode disposed over the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
   an epitaxial layer disposed over a substrate between a source region and a drain region separated along a first direction;
   isolation structures extending into the substrate on opposite sides of the epitaxial layer along a second direction, perpendicular to the first direction;
   a gate dielectric layer disposed over the epitaxial layer, wherein the gate dielectric layer comprises a non-planar layer that curves towards the substrate along outer edges of the gate dielectric layer; and
   a conductive gate electrode disposed over the gate dielectric layer.

2. The transistor device of claim 1, wherein the epitaxial layer has an upper surface that is higher at a center than at outer edges along the second direction.

3. The transistor device of claim 1, wherein the gate dielectric layer is arranged along onto sidewalls of the epitaxial layer at a (111) facet having an angle about 54.7° with respect to a horizontal plane.

4. The transistor device of claim 1, wherein the epitaxial layer comprises a multi-layer epitaxial layer having a plurality of epitaxial layers with different doping concentrations.

5. The transistor device of claim 1, wherein the isolation structures respectively comprise a protrusion arranged between recesses located along outer edges of the isolation structures.

6. The transistor device of claim 5, wherein the protrusion comprises a plateau having a substantially flat surface.

7. The transistor device of claim 5, wherein an upper surface of the substrate underlying the epitaxial layer is below the outer edges of the isolation structures.

8. The transistor device of claim 5, wherein the gate dielectric layer is laterally separated from the protrusion by the conductive gate electrode.

9. The transistor device of claim 1, wherein the epitaxial layer has rounded outer corners.

10. A transistor device, comprising:
    a substrate;
    an epitaxial layer disposed over the substrate and comprising a source region and a drain region separated by a channel region along a first lateral direction, wherein the epitaxial layer has an upper surface that is higher at a center than at rounded outer edges;
    a gate dielectric layer disposed directly over the epitaxial layer; and
    a conductive gate electrode disposed over the gate dielectric layer.

11. The transistor device of claim 10, wherein the gate dielectric layer comprises a non-planar layer that curves towards the substrate along outer edges of the gate dielectric layer.

12. The transistor device of claim 10, further comprising:
    isolation structures extending into the substrate on opposite sides of the source region and the drain region along a second lateral direction, perpendicular to the first lateral direction.

13. The transistor device of claim 12, wherein the conductive gate electrode extends from over a first one of the isolation structures to over a second one of the isolation structures.

14. The transistor device of claim 12, wherein the isolation structures respectively have a protrusion arranged between recesses located along outer edges of the isolation structures.

15. The transistor device of claim 14, wherein the gate dielectric layer is laterally separated from the protrusion by the conductive gate electrode.

16. The transistor device of claim 10, wherein the conductive gate electrode extends laterally past opposing sides of the epitaxial layer.

17. A transistor device, comprising:
    a silicon epitaxial layer disposed over a silicon substrate between a source region and a drain region separated along a first direction, wherein the silicon epitaxial layer has an upper surface that is higher at a center than at rounded outer edges;
    a gate dielectric layer arranged onto the silicon epitaxial layer, wherein the gate dielectric layer curves towards the silicon substrate along outer edges of the gate dielectric layer; and
    a conductive gate electrode disposed over the gate dielectric layer.

18. The transistor device of claim 17, further comprising:
    isolation structures comprising a dielectric material extending into the silicon substrate on opposite sides of the silicon epitaxial layer along a second direction, perpendicular to the first direction, wherein the isolation structures respectively comprise a protrusion arranged between recesses located along outer edges of the isolation structures.

19. The transistor device of claim 18, wherein an upper surface of the silicon substrate underlying the silicon epitaxial layer is below the outer edges of the isolation structures.

20. The transistor device of claim 10, further comprising:
    first and second isolation structures protruding outward from the substrate on opposite sides of the epitaxial layer;
    wherein the first and second isolation structures respectively have a protrusion arranged between cavities located along outermost edges of the first and second isolation structures; and
    wherein the conductive gate electrode and the gate dielectric layer extend from a first cavities within the first isolation structure to a second cavity within the second isolation structure.

* * * * *